US012813078B2

(12) United States Patent

Cui et al.

(10) Patent No.: US 12,813,078 B2

(45) Date of Patent: Nov. 24, 2026

(54) DISPLAY BASE PLATE, PREPARATION METHOD THEREOF AND DISPLAY DEVICE

(71) Applicant: BOE Technology Group Co., Ltd., Beijing (CN)

(72) Inventors: Ying Cui, Beijing (CN); Qing Dai, Beijing (CN); Yue Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 570 days.

(21) Appl. No.: 18/281,817

(22) PCT Filed: Feb. 20, 2023

(86) PCT No.: PCT/CN2023/077135

§ 371 (c)(1),
(2) Date: Sep. 13, 2023

(87) PCT Pub. No.: WO2023/185318

PCT Pub. Date: Oct. 5, 2023

(65) Prior Publication Data

US 2025/0031523 A1 Jan. 23, 2025

(30) Foreign Application Priority Data

Mar. 30, 2022 (CN) ........................ 202210326849.2

(51) Int. Cl.

| | |
|---|---|
| ***H10K 59/122*** | (2023.01) |
| ***H10K 59/12*** | (2023.01) |
| ***H10K 59/35*** | (2023.01) |

(52) U.S. Cl.

CPC ....... *H10K 59/122* (2023.02); *H10K 59/1201* (2023.02); *H10K 59/353* (2023.02)

(58) Field of Classification Search

CPC ............. H10K 59/122; H10K 59/1201; H10K 59/353; H10K 71/135

See application file for complete search history.

(56) References Cited

U.S. PATENT DOCUMENTS

2021/0043706 A1 2/2021 Kobayashi

FOREIGN PATENT DOCUMENTS

CN 111900188 A 11/2020
CN 112186016 A 1/2021

(Continued)

OTHER PUBLICATIONS

Hou et al., CN 104282729, Jan. 14, 2015 (Year: 2015).*
Hou, CN 108010954, May 8, 2018 (Year: 2018).*
Dai et al., CN 111900188, Nov. 6, 2020 (Year: 2020).*

*Primary Examiner* — Mary Ellen Bowman

(74) *Attorney, Agent, or Firm* — WHDA, LLP

(57) ABSTRACT

A display base plate includes sub-pixels, substrate, pixel defining layer disposed on side of substrate which includes first, second and third retaining wall; first and second retaining wall configured to form opening area of sub-pixel, first retaining wall is located between opening areas of adjacent sub-pixels having different colors, second retaining wall is located between opening areas of adjacent sub-pixels having same color; third retaining wall is disposed at side of first retaining wall facing away from substrate, and orthographic projection of third retaining wall on substrate is located within range of orthographic projection of first retaining wall on substrate; surface of side of first retaining wall away from substrate is higher than surface of side of second retaining wall away from substrate, and is lower than a surface of side third retaining wall away from substrate.

18 Claims, 11 Drawing Sheets

(56) References Cited

FOREIGN PATENT DOCUMENTS

| | | | |
|---|---|---|---|
| CN | 113130803 | A | 7/2021 |
| CN | 113193024 | A | 7/2021 |
| CN | 113270461 | A | 8/2021 |
| CN | 114038894 | A | 2/2022 |
| CN | 217426754 | U | 9/2022 |

* cited by examiner

DISPLAY BASE PLATE, PREPARATION METHOD THEREOF AND DISPLAY DEVICE

CROSS-REFERENCE TO RELATED APPLICATION

The present application claims priority to and benefits of Chinese patent application Serial 202210326849.2, and the title of "display base plate, preparation method thereof and display device" filed with the State Intellectual Property Office of P. R. China on Mar. 30, 2022, the entire content of which is incorporated herein by reference.

TECHNICAL FIELD

The present disclosure relates to the technical field of display and, more particularly, to a display base plate, preparation method thereof and display device.

BACKGROUND

An Organic Light-Emitting Diode (OLED) has the advantages of self-luminous, wide viewing angle, fast reaction time, high luminous efficiency, low operation voltage and simple manufacturing process, and is known as a next generation of "star" light-emitting devices.

A Quantum Dot Light-Emitting Diode (QLED) has narrower emission spectrum, purer display color and wider color gamut, so that the QLED has also attracted much attention from the display industry and becomes a powerful candidate for the next generation display technology.

SUMMARY

The present disclosure provides a display base plate, including a plurality of sub-pixels, the display base plate includes:

- a substrate, and a pixel defining layer disposed at a side of the substrate, wherein the pixel defining layer includes a first retaining wall, a second retaining wall and a third retaining wall;
- wherein the first retaining wall and the second retaining wall are configured to form an opening area of the sub-pixel, the first retaining wall is located between the opening areas of adjacent sub-pixels having different colors, and the second retaining wall is located between the opening areas of adjacent sub-pixels having the same color;
- the third retaining wall is disposed at a side of the first retaining wall facing away from the substrate, and an orthographic projection of the third retaining wall on the substrate is located within a range of an orthographic projection of the first retaining wall on the substrate; a surface of a side of the first retaining wall away from the substrate is higher than a surface of a side of the second retaining wall away from the substrate, and is lower than a surface of a side the third retaining wall away from the substrate.

In an optional implementation, the adjacent sub-pixels having different colors are disposed along a row direction, and the adjacent sub-pixels having the same color are disposed along a column direction;

- in the row direction, the orthographic projection of the third retaining wall on the substrate is located within the range of the orthographic projection of the first retaining wall on the substrate.

In an optional implementation, in the row direction, the orthographic projection of the third retaining wall on the substrate is located within the middle of the orthographic projection of the first retaining wall on the substrate.

In an optional implementation, in the column direction, the orthographic projection of the third retaining wall on the substrate is located within a range of an orthographic projection of the second retaining wall on the substrate; or,

- in the column direction, the orthographic projection of the third retaining wall on the substrate completely overlaps with an orthographic projection of the second retaining wall on the substrate; or,
- in the column direction, the orthographic projection of the third retaining wall on the substrate covers an orthographic projection of the second retaining wall on the substrate.

In an optional implementation, in the column direction, the orthographic projection of the third retaining wall on the substrate covers an orthographic projection of the opening area on the substrate.

In an optional implementation, the third retaining walls respectively located at sides of the two adjacent first retaining walls facing away from the substrate are arranged symmetrically with respect to the symmetry axis; wherein an extension direction of the symmetry axis is the column direction, and the two first retaining walls are disposed adjacent to each other in the row direction.

In an optional implementation, a plurality of the third retaining walls are spaced apart from each other in the column direction, and a space between the two adjacent third retaining walls is larger than or equal to a size of the opening area of at least one sub-pixel.

In an optional implementation, in the column direction, the space between the two adjacent third retaining walls is less than or equal to the size of ten sub-pixels.

In an optional implementation, in the row direction, the distance between the orthographic projection boundary of the third retaining wall on the substrate and the orthographic projection boundary of the first retaining wall on the substrate is larger than or equal to 0.5 micrometer and less than or equal to 10 micrometer.

In an optional implementation, the materials of the first retaining wall, the second retaining wall and the third retaining wall are all fluorine-containing photoresist, and the fluorine content in the first retaining wall is larger than that in the second retaining wall, and the fluorine content in the third retaining wall is larger than that in the second retaining wall; or,

- the materials of the first retaining wall and the third retaining wall are both fluorine-containing photoresist, and the material of the second retaining wall is fluorine-free photoresist.

In an optional implementation, the first retaining wall includes a first material layer and a second material layer which are disposed in a stacked manner, and the second material layer is located at a side of the first material layer facing away from the substrate; wherein the first material layer has a lyophilic property and the second material layer has a lyophobic property.

In an optional implementation, the second retaining wall has a lyophilic property.

In an optional implementation, at least a part of the third retaining wall has a lyophobic property.

In an optional implementation, the display base plate further includes an organic material layer disposed in the opening area;

a surface of a side of the organic material layer facing away from the substrate is higher than a surface of the side of the second retaining wall away from the substrate, and is lower than a surface of the side of the first retaining wall away from the substrate.

In an optional implementation, in a direction perpendicular to the substrate, the height of the first retaining wall is larger than or equal to 0.5 micrometer and less than or equal to 2.0 micrometer; and/or, in a direction perpendicular to the substrate, the height of the second retaining wall is larger than or equal to 0.3 micrometer and less than or equal to 2.0 micrometer; and/or, in a direction perpendicular to the substrate, the height of the third retaining wall is larger than or equal to 0.3 micrometer and less than or equal to 2.0 micrometer.

In an optional implementation, in the row direction, the thickness of the first retaining wall is larger than or equal to 5 micrometer and less than or equal to 100 micrometer; and/or, in the column direction, the thickness of the second retaining wall is larger than or equal to 5 micrometer and less than or equal to 100 micrometer.

In an optional implementation, the orthographic projection shape of the third retaining wall on the substrate includes at least one of the following: a triangle, a rectangle, a square, a diamond, a trapezoid, a parallelogram, an ellipse and a circle.

The present disclosure further provides a display device, including any one of the display base plates above-mentioned.

The present disclosure further provides a preparation method of a display base plate, including any one of the display base plates above-mentioned, wherein the display base plate includes a plurality of sub-pixels, the preparation method includes:

providing a substrate;

forming a pixel defining layer on a side of the substrate, wherein the pixel defining layer includes a first retaining wall, a second retaining wall and a third retaining wall; wherein the first retaining wall and the second retaining wall are configured to form an opening area of the sub-pixel, the first retaining wall is located between the opening areas of adjacent sub-pixels having different colors, and the second retaining wall is located between the opening areas of adjacent sub-pixels having the same color; the third retaining wall is disposed on a side of the first retaining wall facing away from the substrate, and an orthographic projection of the third retaining wall on the substrate is within a range of an orthographic projection of the first retaining wall on the substrate; a surface of a side of the first retaining wall away from the substrate is higher than a surface of a side of the second retaining wall away from the substrate, and is lower than a surface of a side of the third retaining wall away from the substrate.

In an optional implementation, the step of, forming the pixel defining layer on the side of the substrate includes:

by adopting a one-time patterning process, synchronously forming the first retaining wall, the second retaining wall and the third retaining wall at a side of the substrate; or, by adopting a first patterning process, synchronously forming the first retaining wall and the second retaining wall at a side of the substrate, and by adopting a second patterning process, forming the third retaining wall at a side of the first retaining wall facing away from the substrate; or, by adopting three patterning processes respectively, forming the second retaining wall, the first retaining wall and the third retaining wall sequentially on a side of the substrate.

In an optional implementation, when a the arrangement direction of adjacent sub-pixels having the same color, the orthographic projection of the third retaining wall on the substrate overlaps with an orthographic projection of the second retaining wall on the substrate, after the step of, forming the pixel defining layer on the side of the substrate further includes:

forming an organic material layer in the opening area by adopting an ink-jet printing process; wherein, in the ink-jet printing process, an orthographic projection of the position that an ink droplet drops on the substrate is located within a range of orthographic projection of the second retaining wall on the substrate.

The above description is merely a summary of the technical solutions of the present disclosure. In order to more clearly understand the technical means of the present disclosure to enable the implementation according to the content of the description, and to make the above-mentioned and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related technologies, the figures that are required to describe the embodiments or the related technologies will be briefly introduced below. Apparently, the figures that are described below are some embodiments of the present disclosure, and a person skilled in the art may obtain other figures according to these figures without paying creative work. It should be noted that, the proportion in the drawings is merely indicative and does not represent actual proportion, and is merely intended to schematically illustrate the content of the present disclosure. The same or similar reference symbols in the drawings indicate the same or similar elements or elements with the same or similar functions.

DETAILED DESCRIPTION

In order to make the purposes, the technical solutions and the advantages of the embodiments of the present disclosure more clearly, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work will fall within the protection scope of the present disclosure.

In the field of light-emitting devices an organic thin film for example a light-emitting functional layer and the like is generally prepared by adopting a solution process. The solution process includes but is not limited to ink-jet printing, spin coating, screen printing and transfer printing, and the like. In the solution process, the ink in an opening area is prone to occur a “climbing effect”. The “climbing effect” refers to that at a position the solution is in contact with the solid, the liquid level of the solution close to the solid-liquid contact position is higher than the liquid level of the solution away from the solid-liquid contact position due to the influence factors for example the characteristics of the solution and surface tension. The “climbing effect” causes a relatively large film thickness at the position close to a retaining wall, and the uneven film thickness in the opening area will further causes uneven pixel brightness, so that the display effect of the display base plate is seriously affected.

Figure 1:
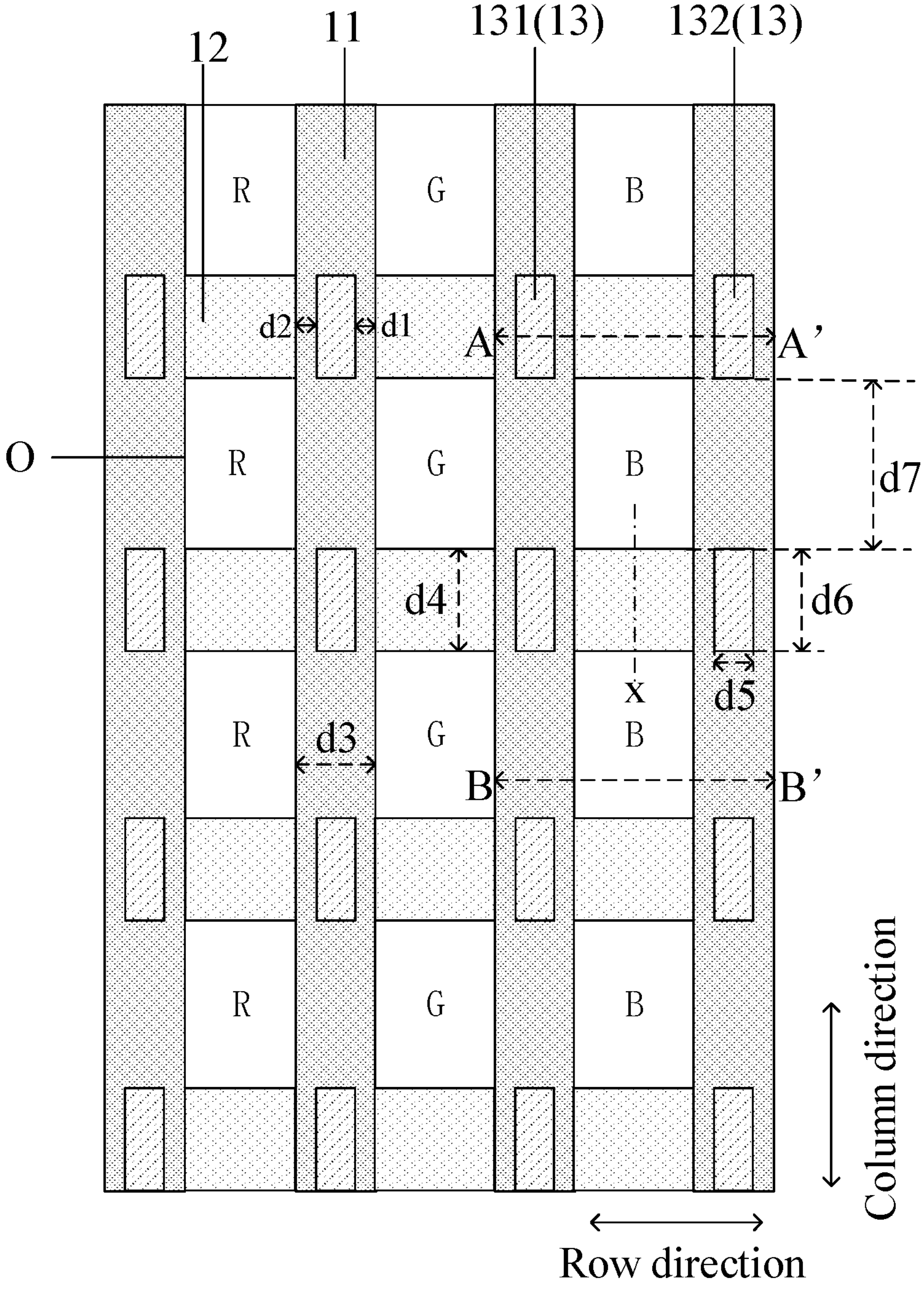
FIG. 1 is a schematic diagram showing a plane structure of a first display base plate.

In order to solve the above-mentioned problems, an embodiment of the present disclosure provides a display base plate including a plurality of sub-pixels. As shown in FIG. 1, the plurality of sub-pixels may have a plurality of colors, for example, the plurality of sub-pixels may include a red sub-pixel R, a blue sub-pixel B and a green sub-pixel G, which is not limited by the present disclosure.

As shown in FIG. 1, the display base plate includes: a substrate 10 (not shown in FIG. 1), and a pixel defining layer disposed at a side of the substrate 10, wherein the pixel defining layer includes a first retaining wall 11, a second retaining wall 12 and a third retaining wall 13.

Wherein, the first retaining wall 11 and the second retaining wall 12 are configured to form an opening area O of the sub-pixel, the first retaining wall 11 is located between the opening areas O of adjacent sub-pixels having different colors, and the second retaining wall 12 is located between the opening areas O of adjacent sub-pixels having the same color.

Figure 2:
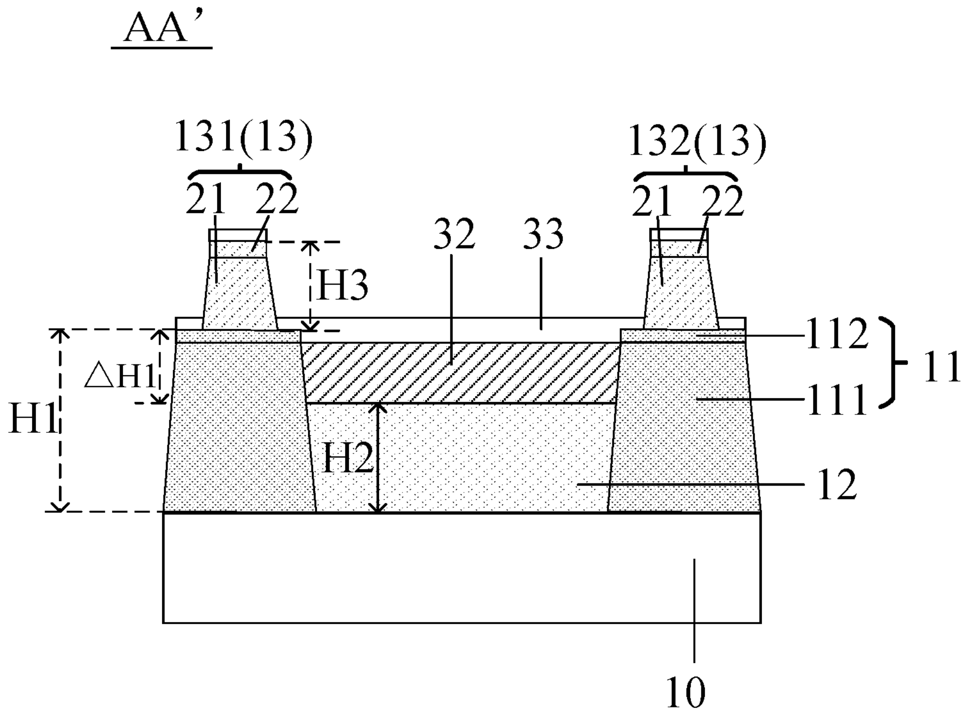
FIG. 2 a schematic diagram showing a cross-sectional structure schematic diagram of the first display base plate taking along line AA'.

Referring to FIG. 2, it is a cross-sectional structure schematic diagram of the first display base plate shown in FIG. 1 taking along AA'. As shown in FIG. 2, the third retaining wall 13 is disposed at a side of the first retaining wall 11 facing away from the substrate 10, and an orthographic projection of the third retaining wall 13 on the substrate 10 is located within a range of an orthographic projection of the first retaining wall 11 on the substrate 10; a surface of a side of the first retaining wall 11 away from the substrate 10 is higher than a surface of a side of the second retaining wall 12 away from the substrate 10, and is lower than a surface of a side of the third retaining wall 13 away from the substrate 10.

In the display base plate provided by the present disclosure, the third retaining wall 13 is disposed at the side of the first retaining wall 11 facing away from the substrate 10, and the surface of the side the third retaining wall 13 away from the substrate 10 is higher than the surface of the side the first retaining wall 11 away from the substrate 10, the third retaining wall 13 and the first retaining wall 11 jointly block ink from overflowing among sub-pixels having different colors to cause cross color, and the ink of different colors is prevented from flowing into an adjacent opening area O, so that the risk of color mixing is reduced. By disposing the third retaining wall 13 on the first retaining wall 11, a height of the first retaining wall 11 may be appropriately reduced, a climbing height of the ink in the opening area O on the first retaining wall 11 may be reduced, the uniformity and flatness of the film layer in the opening area may be improved, the light-emitting quality of the display base plate may be improved, and the resolution of the display base plate may be improved.

In addition, by setting the surface of the side of the first retaining wall 11 away from the substrate 10 higher than the surface of the side of the second retaining wall 12 away from the substrate 10, the higher first retaining wall 11 may block the ink from overflowing among different color sub-pixels to cause color mixing, and the lower second retaining wall 12 may ensure that the ink is fully diffused among the sub-pixels having the same color, and the film layers uniformity inside and among the sub-pixels is improved, so that the brightness uniformity and the display effect are improved.

In the present disclosure, as shown in FIG. 1, the adjacent sub-pixels having different colors are disposed along a row direction, and the adjacent sub-pixels having the same color are disposed along a column direction.

Optionally, in the row direction, the orthographic projection of the third retaining wall 13 on the substrate 10 is located within the range of the orthographic projection of the first retaining wall 11 on the substrate 10.

As shown in FIG. 2, the orthographic projection of the first retaining wall 11 on the substrate 10 covers the orthographic projection of the third retaining wall 13 on the substrate 10. That is, as shown in FIG. 1, in the row direction, the orthographic projection boundary of the third retaining wall 13 on the substrate 10 is retracted relative to the orthographic projection boundary of the first retaining wall 11 on the substrate 10. Correspondingly, a thickness of the third retaining wall 13 in the row direction is less than that of the first retaining wall 11 in the row direction.

By setting the orthographic projection boundary of the third retaining wall 13 on the substrate 10 to be retracted relative to the orthographic projection boundary of the first retaining wall 11 on the substrate 10, ink in the opening areas on both sides may be prevented from climbing onto the third retaining wall 13, so that the climbing height of the ink on the first retaining wall 11 is prevented from being affected by the third retaining wall 13, and the consistency of the climbing height of the ink in every opening area O may be improved, the uniformity of the film layers at different positions of the display base plate may be improved, and the brightness uniformity of the display base plate may be improved.

In a particular implementation, the third retaining walls 13 arranged along the column direction may be a continuous integrated structure, or may be a plurality of discrete structures (as shown in FIG. 1). By setting the orthographic projection boundary of the third retaining wall 13 on the substrate 10 to be retracted relative to the orthographic projection boundary of the first retaining wall 11 on the substrate 10 in the row direction, whether the third retaining wall 13 is a continuous structure or a discrete structure, the height of the retaining wall contacted by the ink in each opening area O may be ensured to be consistent, so that the climbing height of the ink in every opening area O is ensured to be consistent, the problem of uneven film formation at different positions due to different retaining wall heights may be avoided, and the film layers uniformity at different positions of the display base plate may be further improved.

Optionally, as shown in FIGS. 1 and 2, in the row direction, the orthographic projection of the third retaining wall 13 on the substrate 10 is located within the middle of the orthographic projection of the first retaining wall 11 on the substrate 10.

That is, the third retaining wall 13 is centrally disposed on the first retaining wall 11.

Optionally, in the row direction, the distance (d1 and d2 as shown in FIG. 1) between the orthographic projection boundary of the third retaining wall on the substrate and the orthographic projection boundary of the first retaining wall on the substrate is larger than or equal to 0.5 micrometer and less than or equal to 10 micrometer.

As shown in FIG. 1, the distance d1 between the right edge of the orthographic projection of the third retaining wall 13 on the substrate 10 and the right edge of the orthographic projection of the first retaining wall 11 on the substrate 10 may be larger than or equal to 0.5 micrometer and less than or equal to 10 micrometer. The distance d2 between the left boundary of the orthographic projection of the third retaining wall 13 on the substrate 10 and the left boundary of the orthographic projection of the first retaining wall 11 on the substrate 10 may be larger than or equal to 0.5 micrometer and less than or equal to 10 micrometer.

Further, the distance (d1 and d2 as shown in FIG. 1) between the orthographic projection boundary of the third retaining wall 13 on the substrate 10 and the orthographic projection boundary of the first retaining wall 11 on the substrate 10 is larger than or equal to 3 micrometer and less than or equal to 5 micrometer, for example, 4 micrometer, and so on, which is not limited by the present disclosure.

Figure 3:
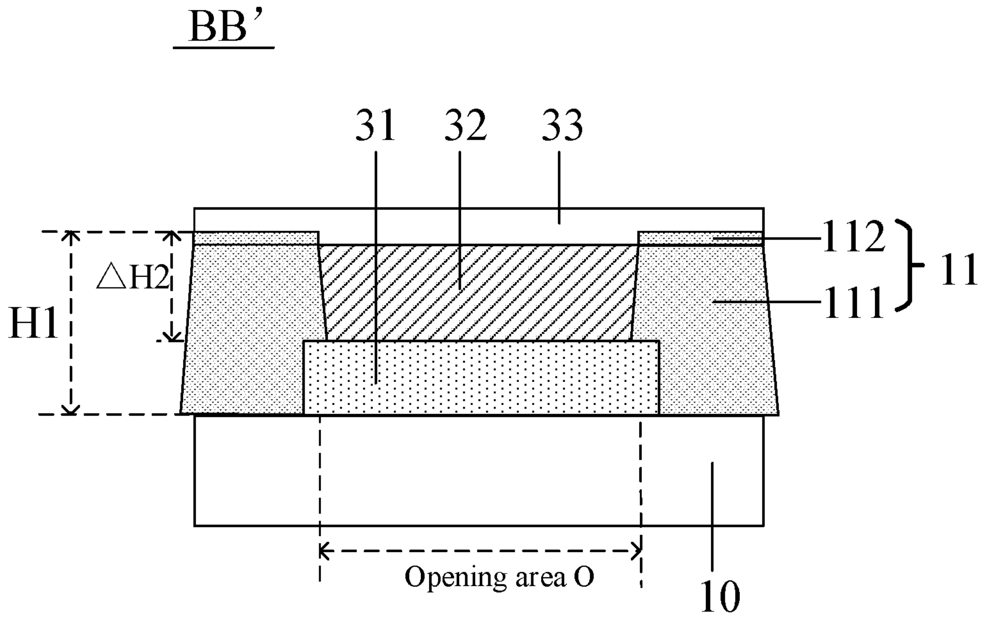
FIG. 3 a schematic diagram showing a cross-sectional structure schematic diagram of the first display base plate taking along line BB'.

Referring to FIG. 3, it is a cross-sectional structure schematic diagram of the display base plate shown in FIG. 1 taking along BB'.

As shown in FIG. 3, the display base plate may further include an organic material layer 32 located in the opening area O. The organic material layer 32 may be formed within the opening area O by an ink-jet printing process.

In the ink-jet printing process, ink may be directly dropped into the opening area O, or it may be dropped on a surface of the side of the second retaining wall 12 facing away from the substrate 10. The ink diffuses from the second retaining wall 12 to the opening area O of the sub-pixels having the same color on both sides, and a solvent in the ink is removed by means of a drying process thereafter, so that the organic material layer 32 is formed within the opening area O.

When the ink is dropped on a surface of the side of the second retaining wall 12 facing away from the substrate 10, it is merely necessary to dispose a nozzle above the second retaining wall 12, and it is not necessary to dispose the nozzles above every opening area O, so that the number of the nozzles in the ink-jet printing device may be reduced, and the structure of the ink-jet printing device may be simplified.

When the ink is dropped on the surface of the side surface of the second retaining wall 12 facing away from the substrate 10, since the second retaining wall 12 has a certain thickness, a height difference between the second retaining wall 12 and the first retaining wall 11 (for example ΔH1, as shown in FIG. 2) is relatively small relative to relative to a height difference between the first retaining wall 11 and the bottom of the opening area O (for example ΔH2, as shown in FIG. 3), thus causing the ink to climb more seriously at a position that the first retaining wall 11 is in contact with the second retaining wall 12, and may also cause the ink to overflow into the adjacent opening area O over the first retaining wall 11, resulting in cross color.

In order to solve the above-mentioned problems, the present disclosure provides the following several particular implementations for disposing the third retaining wall.

In the first to third implementations below, in the column direction, the orthographic projection of the third retaining wall 13 on the substrate 10 (as indicated by d6 in FIGS. 1, 4 and 5) overlaps with the orthographic projection of the second retaining wall 12 on the substrate 10 (as indicated by d4 in FIGS. 1, 4 and 5). In this case, the ink may be dropped on a surface of the side of the second retaining wall 12 facing away from the substrate 10. Since the arrangement of the third retaining wall 13, the height difference of the retaining wall at the contact position between the first retaining wall 11 and the second retaining wall 121 is increased, so that the ink may be dropped on the surface of the side of the second retaining wall 121 facing away from the substrate 10, which not merely simplifies the structure of the ink-jet printing device, but also effectively prevents the ink of different colors from overflowing into the adjacent opening area O, and the risk of color mixing is reduced.

In a first implementation, in the column direction, the orthographic projection (a range indicated by d6 in FIG. 4) of the third retaining wall 13 on the substrate 10 is located within a range of an orthographic projection (a range indicated by d4 in FIG. 4) of the second retaining wall 12 on the substrate 10.

In the present implementation, the width d6 of the third retaining wall 13 in the column direction is less than the width d4 of the second retaining wall 12 in the column direction. For example, when the width d4 of the second retaining wall 12 in the column direction is 50 micrometer, the width d6 of the third retaining wall 13 in the column direction may be larger than or equal to 10 micrometer and less than 50 micrometer.

In the present implementation, in the column direction, the orthographic projection of the third retaining wall 13 on the substrate 10 (as indicated by d6 in FIG. 4) and an orthographic projection of the opening area O on the substrate 10 (as indicated by d7 in FIG. 4) do not overlap, that is, no third retaining wall 13 is disposed at the corresponding position of the opening area O. In this way, the position deviation of the third retaining wall 13 caused by factors for example process instability and the like that aggravating the ink climbing within the opening area may be avoided, and the uniformity of the film layers within the opening area and between the opening areas is ensured.

In a second implementation, in the column direction, the orthographic projection (a range indicated by d6 in FIG. 5) of the third retaining wall 13 on the substrate 10 covers with an orthographic projection (a range indicated by d4 in FIG. 5) of the second retaining wall on the substrate.

In the present embodiment, the width d6 of the third retaining wall 13 in the column direction is larger than the width d4 of the second retaining wall 12 in the column direction. For example, when the width d4 of the second retaining wall 12 in the column direction is 50 micrometer, the width d6 of the third retaining wall 13 in the column direction may be larger than 50 micrometer.

In the present embodiment, since the width d6 of the third retaining wall 13 in the column direction is relatively large, when ink is dropped on the surface of the side of the second retaining wall 12 facing away from the substrate 10, the ink on the second retaining wall 12 may be blocked more thoroughly, so that the ink of different colors may be effectively prevented from overflowing into the adjacent opening area by means of the surface of the first retaining wall 11, and the risk of color mixing may be reduced.

In a third implementation, as shown in FIG. 1, in the column direction, the orthographic projection (a range indicated by d6 in FIG. 1) of the third retaining wall on the substrate 10 completely overlaps with an orthographic projection (the range indicated by d4 in FIG. 1) of the second retaining wall on the substrate 10.

As shown in FIG. 1, the width d6 of the third retaining wall 13 in the column direction is equal to the width d4 of the second retaining wall 12 in the column direction. For example, when the width d4 of the second retaining wall 12 in the column direction is 50 micrometer, the width d6 of the third retaining wall 13 in the column direction is 50 micrometer.

In the present implementation, in the column direction, the orthographic projection of the third retaining wall 13 on the substrate 10 (as indicated by d6 in FIG. 1) and the orthographic projection of the opening area O on the substrate 10 (as indicated by d7 in FIG. 1) do not overlap, that is, the third retaining wall 13 is not disposed at the position corresponding to the opening area O, so that the position deviation of the third retaining wall 13 caused by process instability and other factors that aggravating the ink climbing in the opening area O may be avoided, and the uniformity of the film layers within the opening area and between the opening areas is ensured. At the same time, when the ink is dropped on the surface of the side of the second retaining wall 12 facing away from the substrate 10, the third retaining wall 13 may also effectively block the ink on the second retaining wall 12, so that the ink of different colors may be effectively prevented from overflowing into the adjacent opening area by means of the surface of the first retaining wall 11, and the risk of color mixing may be reduced.

In the first to third implementations described above, ink may be directly printed on the surface of the side of the second retaining wall 12 facing away from the substrate 10.

Figure 6:
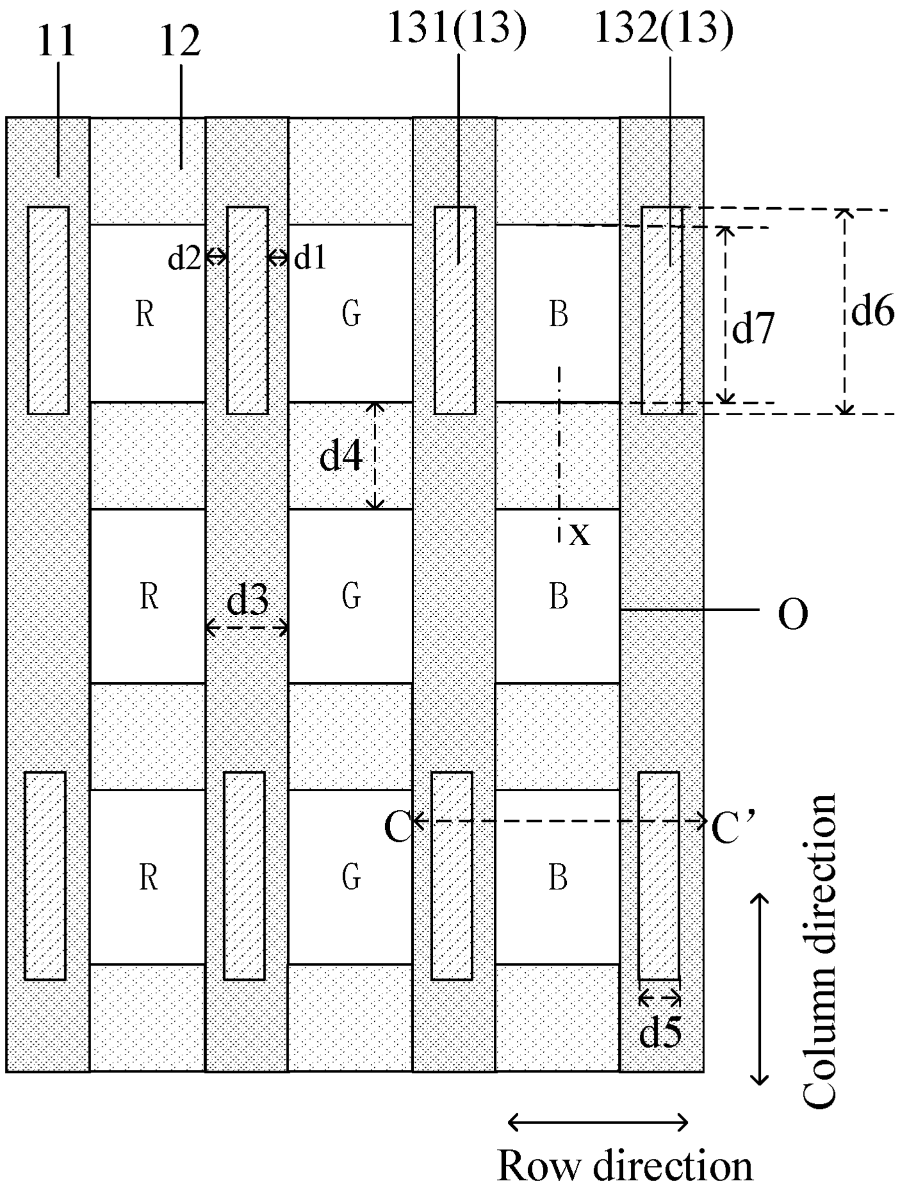
FIG. 6 a schematic diagram showing a plane structure schematic diagram of a fourth display base plate.

In a fourth to third implementation, as shown in FIG. 6, in the column direction, the orthogonal projection of the third retaining wall 13 on the substrate 10 (a range indicated by d6 in FIG. 6) overlaps with the orthogonal projection (a range indicated by d7 in FIG. 6) of the opening area O on the substrate 10.

Optionally, as shown in FIG. 6, in the column direction, the orthographic projection (the range indicated by d6 in FIG. 6) of the third retaining wall on the substrate covers an orthographic projection (the range indicated by d7 in FIG. 6) of the opening area on the substrate.

Figure 7:
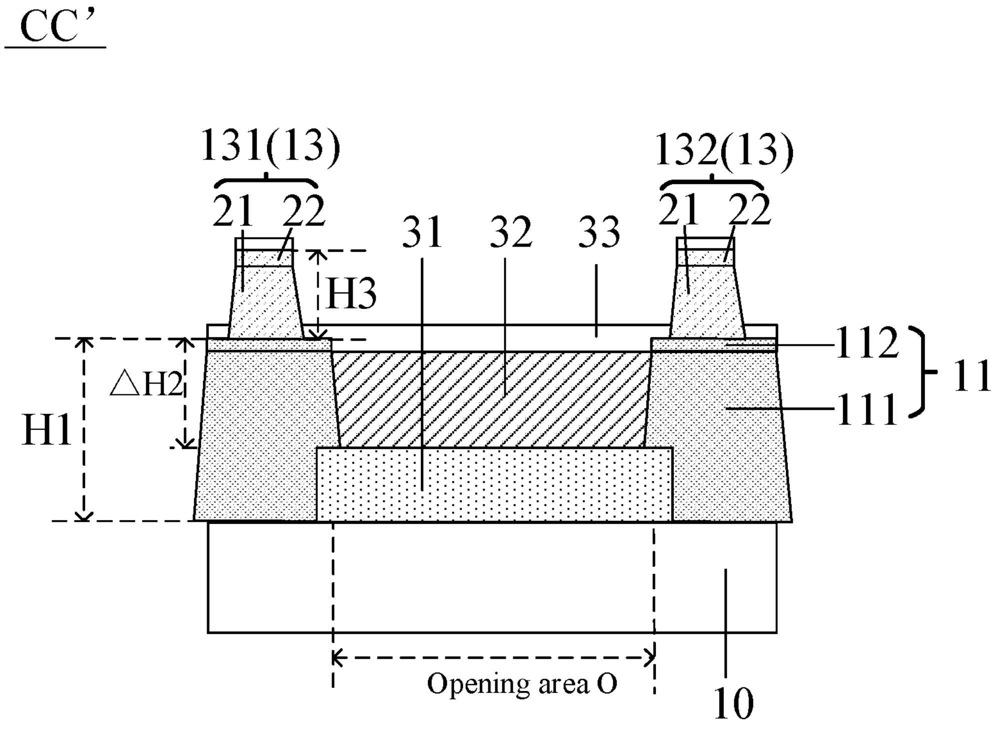
FIG. 7 a schematic diagram showing a cross-sectional structure schematic diagram of the fourth display base plate taking along line CC'.

Referring to FIG. 7, it is a cross-sectional structure schematic diagram of the display base plate shown in FIG. 6 taking along CC'.

In the present implementation, ink may be dropped into the opening area O. Since the height difference between the first retaining wall 11 and the bottom of the opening area O (ΔH2 as shown in FIG. 7) is larger, and the third retaining wall 13 is disposed, so that the risk that the ink in the opening area overflows to the adjacent opening area by means of the first retaining wall 11 may be effectively reduced, and the color mixing risk is reduced.

It should be noted that, the arrangement manner of the third retaining wall 13 is not limited to the above-mentioned realization modes, and may be set according to actual requirements in practical applications.

In an optional implementation, the third retaining walls 13 (for example 131 and 132 shown in FIGS. 1 to 2 and 4 to 9) respectively located at sides of the two adjacent first retaining walls facing away from the substrate are arranged symmetrically with respect to the symmetry axis X.

Wherein, as shown in FIGS. 1, 4 to 6, 8 and 9, an extension direction of the symmetry axis x is the column direction, and the two first retaining walls 11 are disposed adjacent to each other in the row direction.

That is, the third retaining wall 131 located at the surface of the side of a certain first retaining wall 11 facing away from the substrate 10 is disposed opposite to the third retaining wall 132 located at surface of the side of the adjacent first retaining wall 11 facing away from the substrate 10, and is symmetrically arranged with respect to the symmetry axis x.

Since the third retaining walls 13 located at the sides of two adjacent first retaining walls 11 facing away from the substrate 10 are symmetrically arranged on both sides of the second retaining wall 12 or the opening area O, in this way, in the process of dropping ink, the oppositely arranged third retaining walls 13 may block the ink from both sides, so that the ink is prevented from overflowing into the opening area O adjacent to both sides by means of the surface of the first retaining walls 11, and the color mixing risk is reduced.

When the third retaining wall 13 is symmetrically arranged on both sides of the second retaining wall 12, ink may be dropped on the surface of the side of the second retaining wall 12 facing away from the substrate 10. When the third retaining walls 13 are symmetrically arranged on both sides of the opening area O, ink may be dropped into the opening area O. In this way, the third retaining wall 13 may block the ink on both sides during the ink dropping process, and the risk of color mixing is reduced.

In an optional implementation, a plurality of the third retaining walls 13 are spaced apart from each other in the column direction, and a space between the two adjacent third retaining walls is larger than or equal to a size of the opening area of at least one sub-pixel.

Optionally, in the column direction, the space between the two adjacent third retaining walls 13 is less than or equal to the size of ten sub-pixels. Wherein, the size of the sub-pixel is a sum of the sizes of one opening area and one second retaining wall 12 in the column direction.

Further, in order to reduce the risk of overflow, the space between the two adjacent third retaining walls 13 in the column direction may be less than or equal to the size of five sub-pixels.

As shown in FIG. 1, in the column direction, the space between the two adjacent third retaining walls 13 is the size of the opening area of one sub-pixel.

Figure 4:
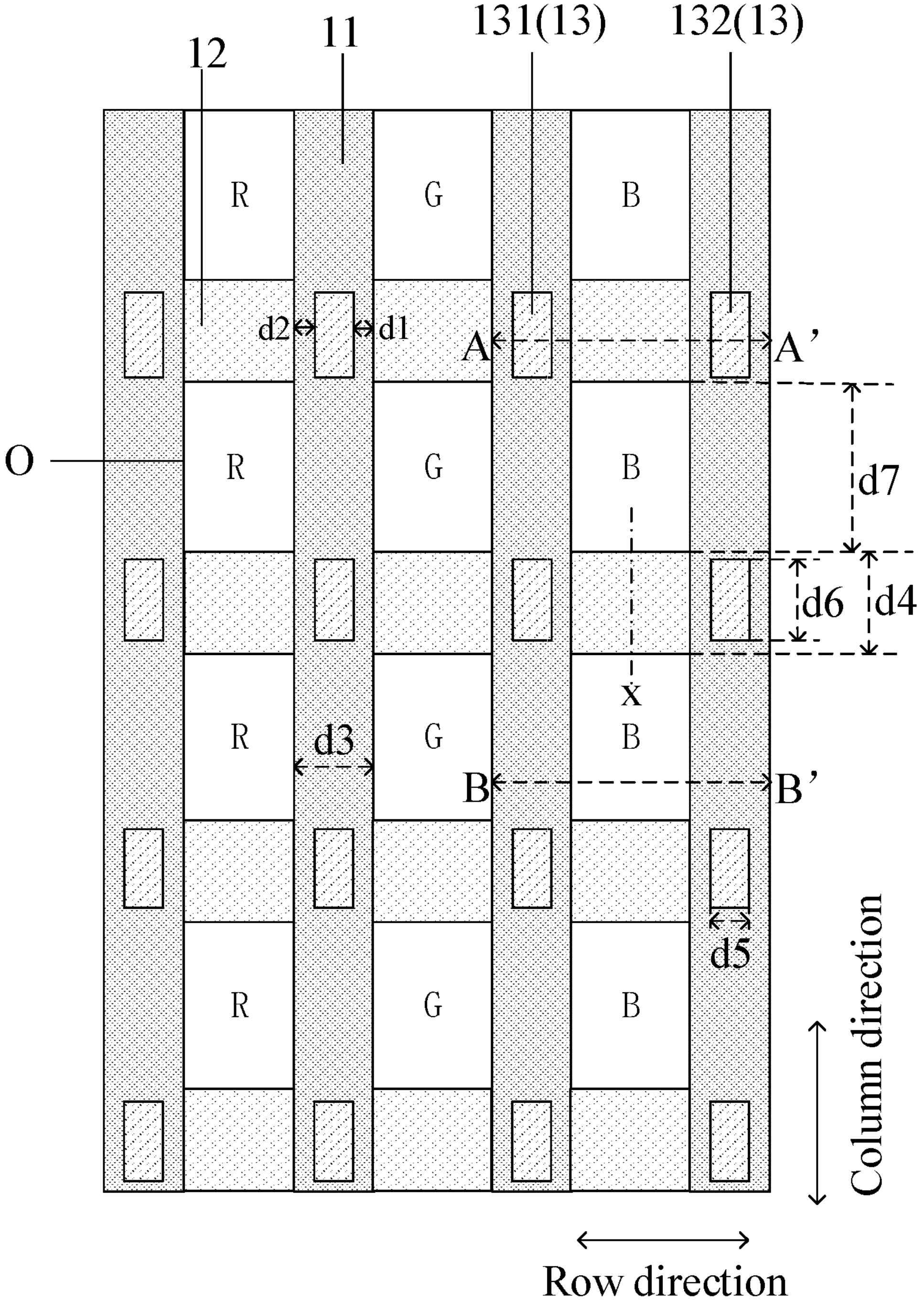
FIG. 4 a schematic diagram showing a plane structure schematic diagram of a second display base plate.
Figure 5:
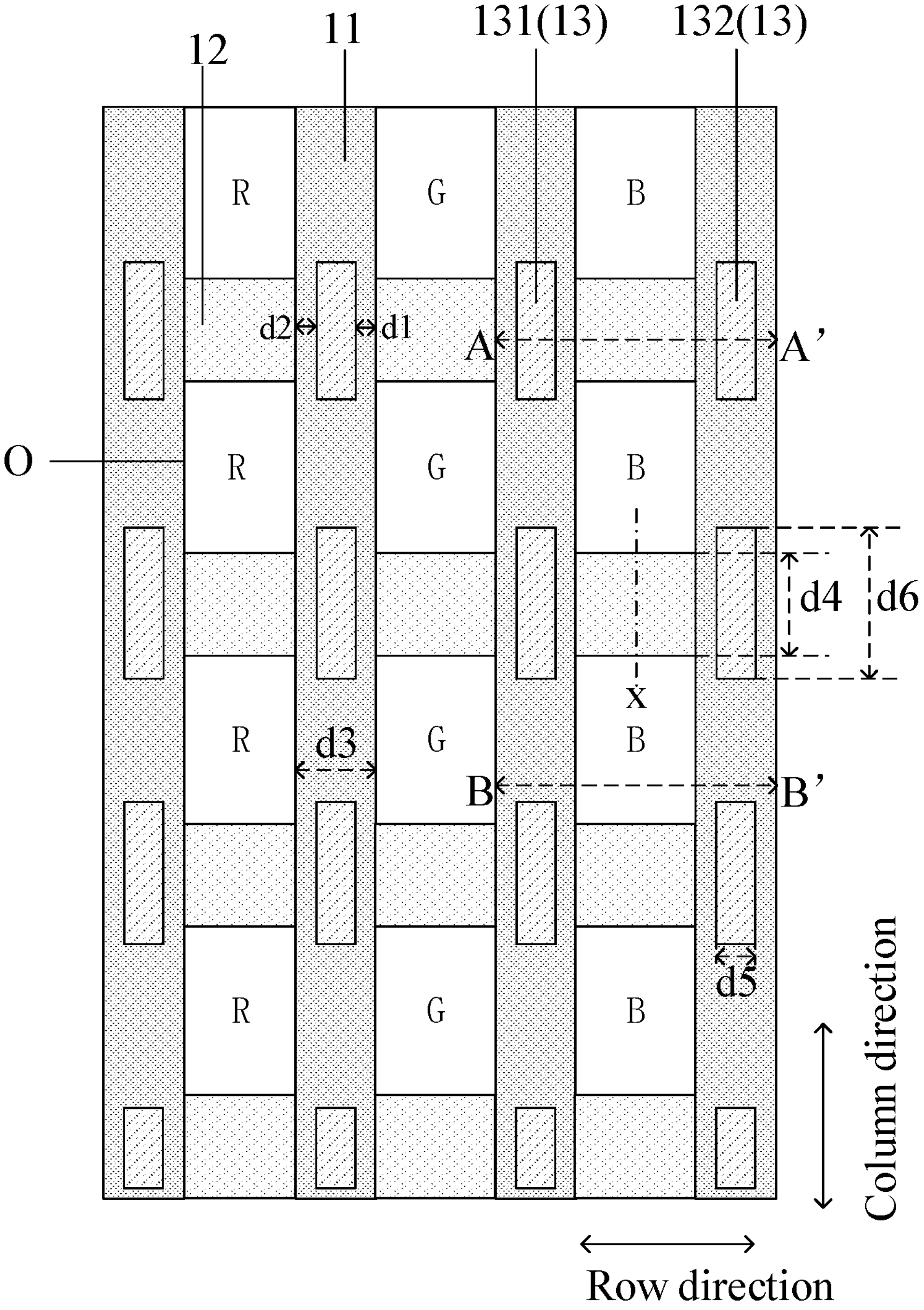
FIG. 5 a schematic diagram showing a plane structure schematic diagram of a third display base plate.

As shown in FIGS. 4 and 5, in the column direction, the space between the two adjacent third retaining walls 13 is approximately the size of the opening area of one sub-pixel.

As shown in FIG. 6, in the column direction, the space between the two adjacent third retaining walls 13 is approximately a sum of the size of one sub-pixel opening area and the size of two second retaining walls.

Figure 8:
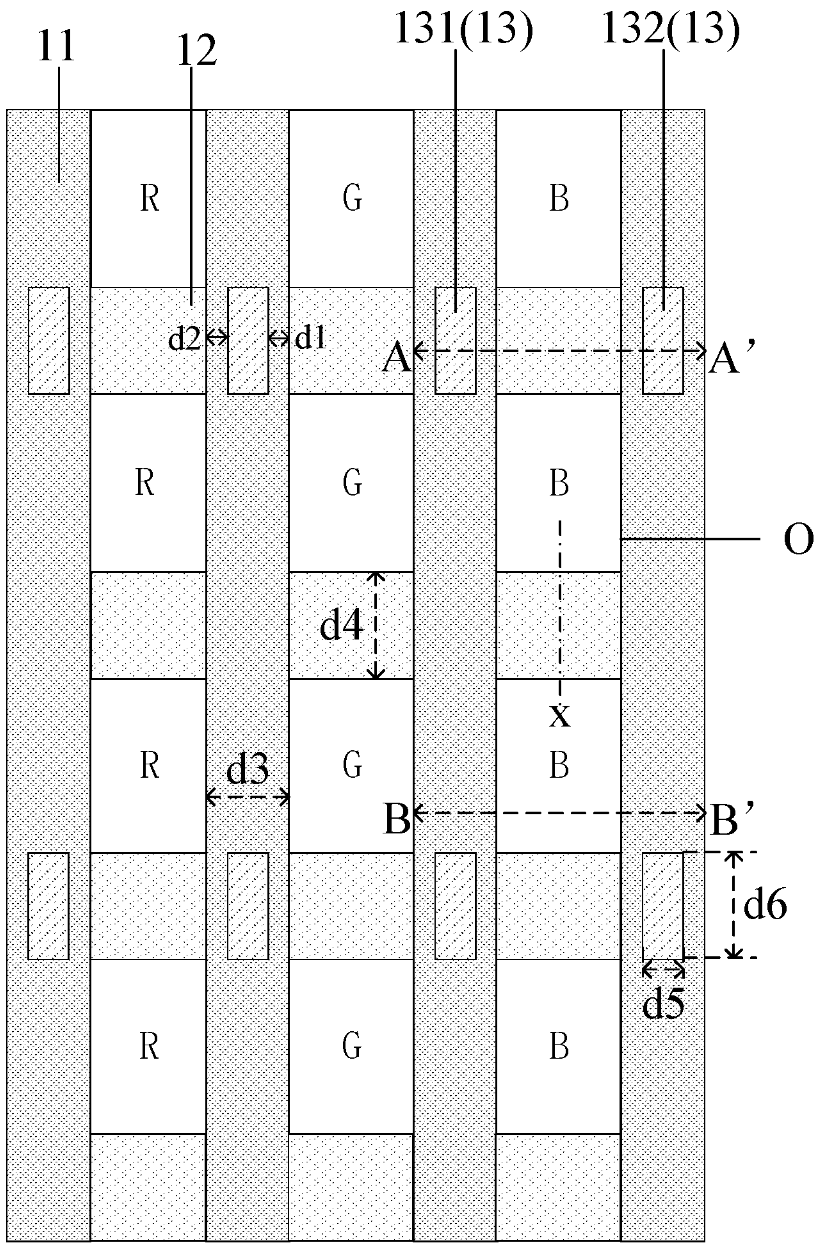
FIG. 8 a schematic diagram showing a plane structure schematic diagram of a fifth display base plate.

As shown in FIG. 8, in the column direction, the space between the two adjacent third retaining walls 13 is a sum of the size of two sub-pixel opening areas and the size of one second retaining wall.

Figure 9:
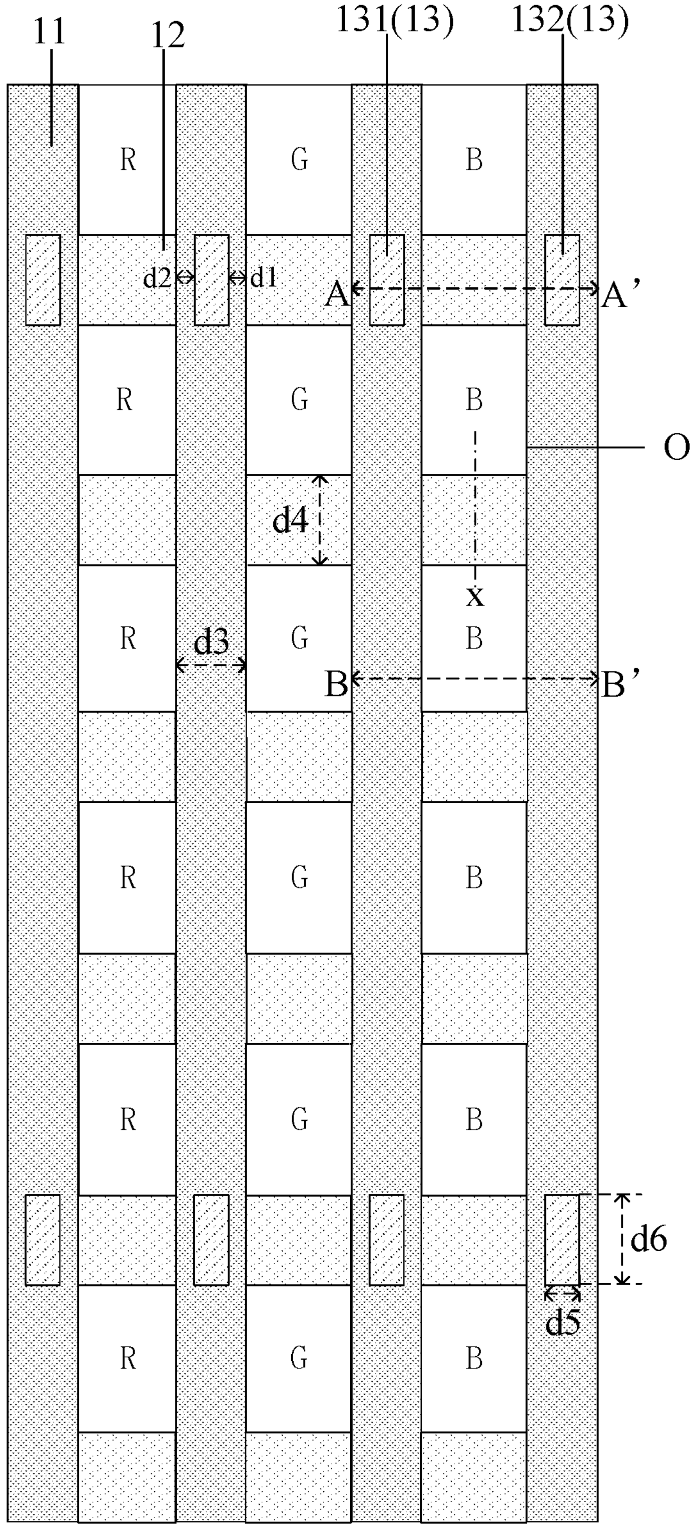
FIG. 9 a schematic diagram showing a plane structure schematic diagram of a sixth display base plate.

As shown in FIG. 9, in the column direction, the space between the two adjacent third retaining walls 13 is a sum of the size of four sub-pixel opening areas and the size of three second retaining walls.

In a particular implementation, the space between the two adjacent third retaining walls 13 may be determined according to factors for example printing overflow characteristics and material characteristics of every retaining wall, which is not limited in the present disclosure.

Since the arrangement of the third retaining wall 13 may prevent overflow and climbing in the process of printing ink, the ink printing position may be corresponded to the position of the third retaining wall 13, that is, ink nozzles may be arranged at the position that the third retaining wall 13 is disposed, and the ink may flow to other sub-pixels having the same color by means of the second retaining wall 12, thus the number of nozzles of the ink-jet printing device may be reduced.

It should be noted that, the third retaining wall 13 located at the side of the same first retaining wall 11 away from the substrate 10 may also be an integrated structure, which is not limited by the present disclosure.

In a particular implementation, the host materials of the first retaining wall 11, the second retaining wall 12 and the third retaining wall 13 may be the same. For example, the host material s of the first retaining wall 11, the second retaining wall 12 and the third retaining wall 13 are all photoresist. The photoresist may particularly be a positive photoresist or a negative photoresist, which is not limited in the present disclosure.

In order to better prevent cross color caused by overflow between inks of different colors, and prevent the ink in the opening area O from climbing too high on the first retaining wall 11, the first retaining wall 11 and the third retaining wall 13 may include a lyophobic material, and the second retaining wall 12 may not include a lyophobic material or include a small amount of lyophobic material.

In an optional implementation, the materials of the first retaining wall 11, the second retaining wall 12 and the third retaining wall 13 are all fluorine-containing photoresist, and the fluorine content in the first retaining wall 11 is larger than that in the second retaining wall 12, and the fluorine content in the third retaining wall 13 is larger than that in the second retaining wall 12.

Illustratively, the host materials of the first retaining wall 11, the second retaining wall 12 and the third retaining wall 13 are all photoresist materials, for example polyimide series materials or polymethyl methacrylate series materials and the like. By doping or bonding fluorine-containing substances in the host material, the first retaining wall 11 and the third retaining wall 13 may have a lyophobic property. By doping or bonding a small amount of fluorine-containing substances in the host material, the second retaining wall 12 may have a lyophilic property relative to the first retaining wall 11 and the third retaining wall 13.

In an optional implementation, the materials of the first retaining wall 11 and the third retaining wall 13 are both fluorine-containing photoresist, and the material of the second retaining wall 12 is fluorine-free photoresist.

Illustratively, the host materials of the first retaining wall 11, the second retaining wall 12 and the third retaining wall 13 are all photoresist materials for example polyimide series materials or polymethyl methacrylate series materials and the like. By doping or bonding fluorine-containing substances in the host material, the first retaining wall 11 and the third retaining wall 13 may have lyophobic properties. The host material of the second retaining wall 12 is not doped or bonded with fluorine-containing substances, so that the second retaining wall 12 has a lyophilic property.

In the present embodiment, since the host material of the second retaining wall 12 is not doped or bonded with fluorine-containing substances, it may be avoided that the second retaining wall 12 has a lyophobic property after a post-baking process.

In an optional implementation, as shown in FIGS. 2, 3 and 7, the first retaining wall 11 includes a first material layer 111 and a second material layer 112 which are disposed in a stacked manner, and the second material layer 112 is located at a side of the first material layer 111 facing away from the substrate 10.

Wherein, the first material layer 111 has a lyophilic property and the second material layer 112 has a lyophobic property.

By disposing the first material layer 111 with the lyophilic property on a side close to the substrate 10, in the process of ink-jet printing, ink may be evenly spread over the entire opening area O since the bottom lyophilic material layer has strong attraction to the ink, so that the flatness of the film layer within the opening area O is improved. By disposing the second material layer 112 having the lyophobic property on a side away from the substrate 10, the lyophobic material at the top has a repulsion effect on the ink, on one hand, the climbing height of the ink may be effectively reduced, and on the other hand, color mixing caused by overflow between the sub-pixels of different colors may be avoided.

In a particular implementation, by doping or bonding fluorine-containing substances in the host materials for example polyimide series materials or polymethyl methacrylate series materials and the like, and adopting a coating process, a pre-baking process, an exposure process, a developing process, and the like sequentially, enable the top of the host material to have a lyophobic property, so that the first material layer 111 and the second material layer 112 may be formed.

In order to make ink between two adjacent first retaining walls 11 flow better between different sub-pixels, optionally, the second retaining wall 12 has a lyophilic property. For example, the material of the second retaining wall 12 may be fluorine-free photoresist to make the second retaining wall 12 has the lyophilic property.

Since the second retaining wall 12 has the lyophilic property, it is beneficial for ink to flow smoothly between two adjacent first retaining walls, and the uniformity of the film layer between pixels is improved.

In order to better prevent cross color caused by overflow between ink of different colors, and prevent the ink in the opening area O from climbing on the third retaining wall 13, optionally, at least a part of the third retaining wall 13 has a lyophobic property, or the third retaining wall 13 includes a lyophobic material. For example, the material of the third retaining wall 13 may be fluorine-containing photoresist.

For example, as shown in FIGS. 2 and 7, the third retaining wall 13 may include a third material layer 21 and a fourth material layer 22 which are arranged in a stacked manner, and the fourth material layer 22 is located at a side of the third material layer 21 facing away from the substrate 10. The third material layer 21 has a lyophilic property and the fourth material layer 22 has a lyophobic property.

Since the third material layer 21 having the lyophilic property has strong attraction to the ink overflowing to the surface of the first retaining wall 11, the ink may be prevented from overflowing upwards. The fourth material layer 22 having the lyophobic property has a repelling effect on the ink, so that color mixing caused by ink overflow between the sub-pixels of different colors may be avoided.

In a particular implementation, by doping or bonding fluorine-containing substances in the host materials for example polyimide series materials or polymethyl methacrylate series materials and the like, and adopting a coating process, a pre-baking process, an exposure process, a developing process, and the like sequentially, enable the top of the host material to have a lyophobic property, to form the third material layer 21 and the fourth material layer 22.

Optionally, the entire surface of the third retaining wall 13 may has the lyophobic property, so that ink climbing and color mixing caused by overflow may be better suppressed.

As shown in FIGS. 3 and 7, the display base plate further includes an organic material layer 32 disposed in the opening area O.

In the present disclosure, the organic material layer 32 is an organic film layer formed by an ink-jet printing process. Consequently, the surface of the side of the first retaining wall 11 facing away from the substrate 10 is not disposed with the organic material layer 32, while the surface of the side of the second retaining wall 12 facing away from the substrate 10 is disposed with the organic material layer 32.

Optionally, a surface of a side of the organic material layer 32 facing away from the substrate 10 is higher than a surface of the side of the second retaining wall 12 away from the substrate 10, and is lower than a surface of the side of the first retaining wall 11 away from the substrate 10.

Optionally, as shown in FIGS. 3 and 7, the height of the surface of the side of the organic material layer 32 facing away from the substrate 10 is consistent or flush with that of surface of the side of the first material layer 111 facing away from the substrate 10.

Wherein, the organic material layer 32 may include one or more of the following film layers: organic film layers for example a hole injection layer, a hole transport layer, and a light-emitting functional layer and the like which are sequentially arranged in a stacked manner.

Optionally, an auxiliary functional film layer 33 is further included in the opening area O. and the auxiliary functional film layer 33 may include one or more of the following film layers: an electron transport layer, an electron injection layer and a cathode layer stacked on the side of the organic material layer 32 facing away from the substrate 10. In a particular implementation, one or more of the electron transport layers, the electron injection layer and the cathode layer may be formed by adopting an evaporation process. Orthogonal projections of the electron transport layer, the electron injection layer and the cathode layer on the substrate 10 may cover the substrate 10 completely.

In order to realize electroluminescence, as shown in FIGS. 3 and 7, the display base plate above-mentioned may further include an anode layer 31 located at a side of the organic material layer 32 close to the substrate 10.

Wherein, the anode layer 31 is located between the substrate 10 and the pixel defining layer. The anode layer 31 may include a plurality of anodes arranged in one-to-one correspondence with the opening areas. The bottom of the opening area O may be a surface of the anode layer 31 facing away from the substrate 10.

The light-emitting functional layer may include a plurality of light-emitting layers located in every opening area O. In order to realize color luminous, the light-emitting functional layer may include a red light-emitting layer, a green light-emitting layer and a blue light-emitting layer. In the present embodiment, the sub-pixels having the same color are the light-emitting layers having the same light-emitting color in the opening areas O of the sub-pixels.

In the opening area o of every sub-pixel, the anode, the light-emitting layer and the cathode layer form a laminated structure, so that forming an electroluminescent diode.

Illustratively, the material of the light-emitting layer may be an organic electroluminescent material, and correspondingly, the electroluminescent diode is an organic light-emitting diode. The material of the light emitting layer may also be quantum dots, and correspondingly, the electroluminescent diode is a quantum dot light-emitting diode. It should be noted that, the opening area of the pixel defining layer is the light-emitting area of the sub-pixel that the electroluminescent diode is located.

In a particular implementation, the display base plate may further include a transistor array layer (not shown in figure) disposed between the anode layer 31 and the substrate 10. The transistor array layer may include a plurality of pixel circuits, and the anode may be electrically connected with the pixel circuit to input a driving current to the anode by means of the pixel circuit, and apply a corresponding voltage to the cathode, so that driving the light-emitting layer to emit light. Illustratively, the pixel circuit may include a storage capacitor and a transistor electrically connected to the storage capacitor. For example, the pixel circuit may be a 2T1C pixel circuit, a 3T1C pixel circuit or a 7T1C pixel circuit. The 2T1C pixel circuit includes two transistors and one storage capacitor. The 3T1C pixel circuit includes three transistors and one storage capacitor. The 7T1C pixel circuit includes 7 transistors and one storage capacitor.

Optionally, as shown in FIG. 2, in a direction perpendicular to the substrate 10, the height H1 of the first retaining wall 11 is larger than or equal to 0.5 micrometer and less than or equal to 2.0 micrometer. Further, in the direction perpendicular to the substrate 10, the height H1 of the first retaining wall 11 may be greater than or equal to 0.3 micron and less than or equal to 1.2 micron, which is not limited by the present disclosure.

Optionally, as shown in FIG. 2, in a direction perpendicular to the substrate 10, the height of the second retaining wall 12 is larger than or equal to 0.3 micrometer and less than or equal to 2.0 micrometer. Further, the height of the second retaining wall 12 may be larger than or equal to 0.1 micrometer and less than or equal to 0.8 micrometer, which is not limited by the present disclosure.

Optionally, as shown in FIG. 2, in a direction perpendicular to the substrate 10, the height of the third retaining wall 13 is larger than or equal to 0.3 micrometer and less than or equal to 2.0 micrometer.

For example, for a product of 160 ppi, the height H1 of the first retaining wall 11 is larger than or equal to 0.8 micrometer and less than or equal to 1.2 micrometer in the direction perpendicular to the substrate 10. The height H2 of the second retaining wall 12 is larger than or equal to 0.3 micrometer and less than or equal to 0.8 micrometer. The height H3 of the third retaining wall 13 is larger than or equal to 0.3 micrometer and less than or equal to 1.0 micrometer.

Optionally, as shown in FIG. 1, in the row direction, the thickness d3 of the first retaining wall 11 is larger than or equal to 5 micrometer and less than or equal to 100 micrometer. Further, the thickness d3 of the first retaining wall 11 is larger than or equal to 5 micrometer and less than or equal to 50 micrometer, which is not limited by the present disclosure. For example, for a product of 160 ppi, the thickness d3 of the first retaining wall 11 is larger than or equal to 10 micrometer and less than or equal to 20 micrometer.

Optionally, in the column direction, the thickness d4 of the second retaining wall 12 is larger than or equal to 5 micrometer and less than or equal to 100 micrometer. Further, the thickness d4 of the second retaining wall 12 is larger than or equal to 10 micrometer and less than or equal to 100 micrometer, which is not limited by the present disclosure. For example, for a product of 160 ppi, the thickness d4 of the second retaining wall is 50 micrometer.

In a particular implementation, the wall thickness d5 of the third retaining wall 13 may be determined according to the wall thickness d3 of the first retaining wall 11. For example, for a product of 160 ppi, the wall thickness d3 of the first retaining wall 11 is larger than or equal to 10 micrometer and less than or equal to 20 micrometer. The wall thickness d5 of the third retaining wall 13 may be larger than or equal to 4 micrometer and less than or equal to 10 micrometer, which is not limited in the present disclosure.

Optionally, the orthographic projection of the first retaining wall 11 on the substrate 10 may be a linear structure having a certain width (as shown in FIG. 1), and the like, which is not limited by the present disclosure.

Optionally, the orthographic projection of the second retaining wall 12 on the substrate 10 may be a rectangular, and the like, which is not limited by the present disclosure.

Figure 10:
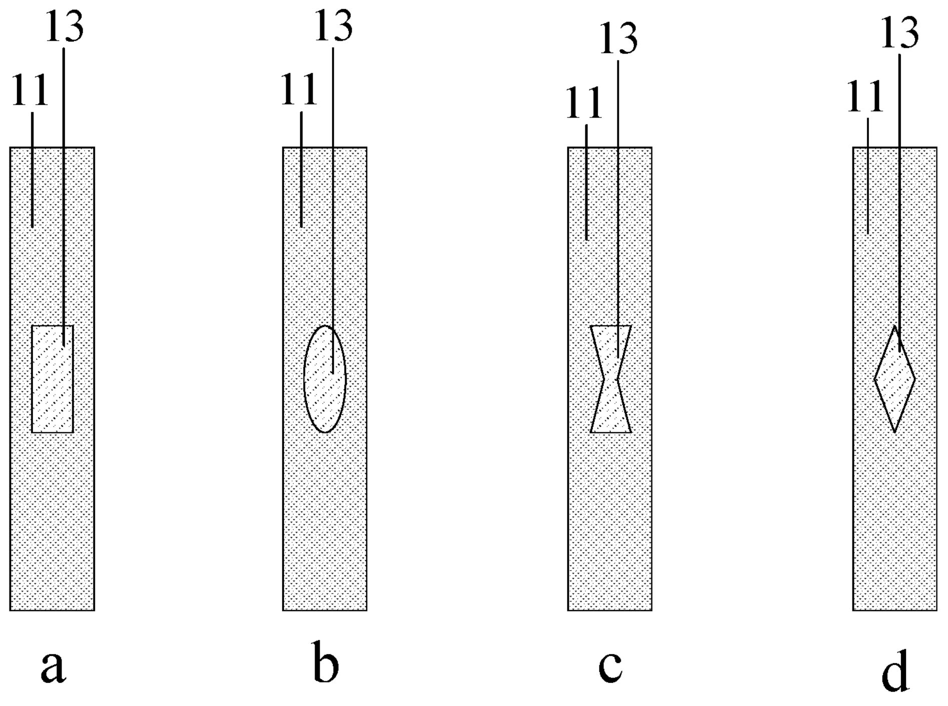
FIG. 10 a schematic diagram showing a plane structure schematic diagram of several third retaining walls.

Optionally, the orthographic projection shape of the third retaining wall 13 on the substrate 10 includes at least one of the following: a triangle (as shown in figure a in FIG. 10), a rectangle, a square, a diamond (as shown in figure d in FIG. 10), a trapezoid, a parallelogram, an ellipse (as shown in figure b in FIG. 10) and a circle and the like. As shown in figure c in FIG. 10, the orthographic projection of the third retaining wall 13 on the substrate 10 includes two identical trapezoids with short sides connected.

Optionally, the orthographic projection shape of the opening area of the sub-pixel on the substrate 10 may be rectangular (as shown in FIG. 1), and may also be other polygons, a chamfer polygon, an ellipse, a racetrack, a waist circle, a gourd shape, and the like, which is not limited by the present disclosure.

In addition, sizes of different positions of the opening area in the row direction may be the same size or different sizes. For example, in a same opening area, the size of a first position in the row direction may be larger than the size of a second position in the row direction, so that in the process of ink printing, ink may be dropped into the first position in the opening area, so that the requirements for drop accuracy may be reduced and the process difficulty may be reduced.

It should be noted that, the "contact angle" refers to an included angle between solid-liquid boundary lines, which is a measure of wetting degree. If the contact angle between a solid material and a liquid is larger than a first critical angle, it indicates that the solid material is a lyophobic material, and the larger the contact angle between the solid material and the liquid, the better the lyophobic performance. If the contact angle between the solid material and the liquid is less than a second critical angle, it indicates that the solid material is a lyophilic material, and the smaller the contact angle between the solid and the liquid, the better the lyophilic performance.

For example, if the contact angle between the solid material and ink is larger than the first critical angle of 35°, it may be indicated that the solid material is a lyophobic material. If the contact angle between the solid material and ink is less than the second critical angle of 5°, it may be indicated that the solid material is a lyophilic material.

It should be noted that, in an actual process, due to the limitation of process conditions or other factors, the same among the above-mentioned features are not exactly the same, and some deviations may exist, consequently, the same relationship among the above-mentioned features may all fall within the protection scope of the present disclosure as long as the above-mentioned conditions are substantially satisfied. For example, the same may be the same allowed within an allowable error range.

The present disclosure further provides a display device, including the display base plate provided in any embodiment above-mentioned.

A person skilled in the art may understand that, the display device has the advantages of the previous display base plate.

It should be noted that, the display device in the present embodiment may be any product or component with two-dimensional (2D) or three-dimensional (3D) display function, for example a display panel, an electronic paper, a mobile phone, a tablet computer, a TV set, a notebook computer, a digital photo frame and a navigator and the like.

The present disclosure further provides a preparation method of a display base plate, wherein the display base plate includes a plurality of sub-pixels, the preparation method including:

S01, providing a substrate.

S02, forming a pixel defining layer on a side of the substrate, wherein the pixel defining layer includes a first retaining wall 11, a second retaining wall 12 and a third retaining wall 13, as shown in FIG. 1.

Wherein, the first retaining wall 11 and the second retaining wall 12 are configured to form an opening area O of the sub-pixel, the first retaining wall 11 is located between the opening areas O of adjacent sub-pixels having different colors, and the second retaining wall 12 is located between the opening areas O of adjacent sub-pixels having the same color.

As shown in FIG. 2, the third retaining wall 13 is disposed on a side of the first retaining wall 11 facing away from the substrate 10, and an orthographic projection of the third retaining wall 13 on the substrate 10 is within a range of an orthographic projection of the first retaining wall 11 on the substrate 10; a surface of a side of the first retaining wall 11 away from the substrate 10 is higher than a surface of a side of the second retaining wall 12 away from the substrate 10, and is lower than a surface of a side of the third retaining wall 13 away from the substrate 10.

The preparation method provided in the present embodiment may prepare the display base plate provided in any of the above-mentioned embodiments.

In a first optional implementation, step S02 may include: by adopting a one-time patterning process, synchronously forming the first retaining wall 11, the second retaining wall 12 and the third retaining wall 13 at a side of the substrate 10.

Particularly, the first retaining wall 11, the second retaining wall 12 and the third retaining wall 13 may be formed simultaneously by adopting a one-time exposure and development process, so that the process of manufacturing the pixel defining layer may be simplified.

In the present implementation, the first retaining wall 11, the second retaining wall 12 and the third retaining wall 13 may use the same host material.

In a second optional implementation, step S02 may include: by adopting a first patterning process, synchronously forming the first retaining wall 11 and the second retaining wall 12 at a side of the substrate 10, and by adopting a second patterning process, forming the third retaining wall 13 at a side of the first retaining wall 11 facing away from the substrate 10.

Particularly, an one-time exposure process may be adopted to form the structure of the first retaining wall 11 at both the position of the first retaining wall 11 and the position of the second retaining wall 12, for example a structure with a lyophilic material at the bottom and a lyophobic material at the top, and the lyophobic material at the top of the second retaining wall 12 may be removed by an one-time development process to form the second retaining wall 12 and the first retaining wall 11 thereafter. Subsequently, a two-time exposure and development process may be adopted to form a third retaining wall 13 on the side of the first retaining wall 11 facing away from the substrate 10.

In the present embodiment, since the third retaining wall 13 is formed separately by the one-time patterning process, a material different from those of the first retaining wall and the second retaining wall may be adopted. The first retaining wall and the second retaining wall may adopt the same host material.

It should be noted that, the host material of the third retaining wall 13 may also be the same as the first retaining wall and the second retaining wall, which is not limited by the present disclosure.

In a third optional implementation, step S02 may include: by adopting three patterning processes respectively, forming the second retaining wall 12, the first retaining wall 11 and the third retaining wall 13 sequentially on a side of the substrate 10.

In a particular implementation, after step S02, the following steps may be further included: forming an organic material layer in the opening area by adopting an ink-jet printing process.

As shown in FIGS. 1, 4 and 5, at an arrangement direction of adjacent sub-pixels having the same color, the orthographic projection (in the range indicated by d6 in FIGS. 1, 4 and 5) of the third retaining wall 13 on the substrate 10 overlaps with an orthographic projection (in the range indicated by d4 in FIGS. 1, 4 and 5) of the second retaining wall on the substrate, in the ink-jet printing process, an orthographic projection of the position that an ink droplet drops on the substrate 10 is located within a range of orthographic projection of the second retaining wall 12 on the substrate 10.

When ink is dropped on the surface of the side of the second retaining wall 12 facing away from the substrate 10, the ink diffuses from the second retaining wall 12 to the opening areas O of the sub-pixels having the same color on both sides, so that nozzles merely need to be disposed above the second retaining wall 12, and it is not necessary to arrange the nozzles above every opening area O, so that the number of the nozzles in the ink-jet printing device may be reduced and the structure of the ink-jet printing device may be simplified.

In addition, since the arrangement of the third retaining wall 13, the height difference at the contact position between the first retaining wall 11 and the second retaining wall 12 is increased. Consequently, by dropping ink on the surface of the side of the second retaining wall 12 facing away from the substrate 10, the ink of different colors may be effectively prevented from overflowing into the adjacent opening area O by means of the surface of the first retaining wall 11, and the risk of color mixing is reduced.

It should be noted that, when the first retaining wall 11, the second retaining wall 12 and the third retaining wall 13 are made of the same host material, no matter the first retaining wall 11, the second retaining wall 12, and the third retaining wall 13 are formed synchronously by the one-time patterning process, or formed by multiple-time patterning processes, no obvious boundary exists between the first retaining wall 11, the second retaining wall 12, and the third retaining wall 13, as shown in FIG. 2, and a gradient area (not shown in the figure) with slow transition may exist between them.

The preparation method of the display base plate shown in FIG. 1 will be described in detail below with reference to FIGS. 11 to 16.

Figure 11:
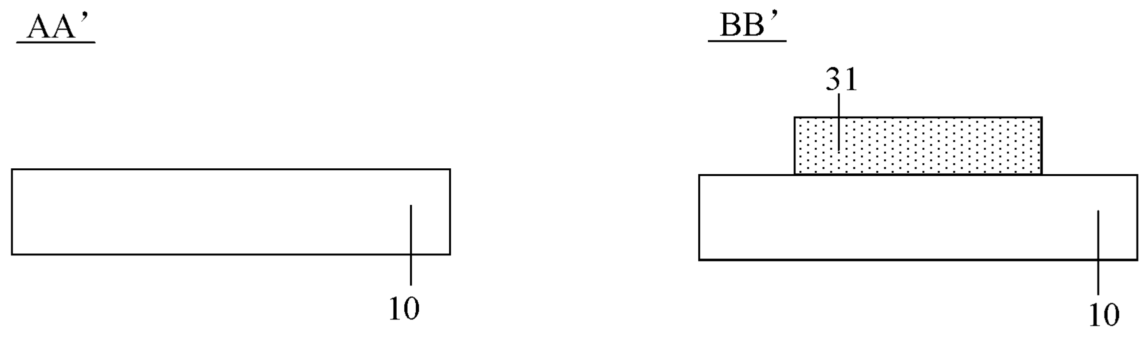
FIG. 11 a schematic diagram showing a cross-sectional structure schematic diagram of the display base plate after completing the preparation of an anode layer.

The preparation method of the display base plate provided by AN embodiment of the present disclosure may include the following steps:

(1) Providing a substrate 10, and a transistor array layer (not shown in the figure) and an anode layer 31 are sequentially formed on one side of the substrate 10, as shown in FIG. 11. Wherein, the transistor array layer may be formed by a method combining dry etching with wet etching.

When the display base plate is a bottom emitter structure, the material of the anode layer 31 may be, for example, indium tin oxides (ITO), for example. When the display base plate is a top emitter structure, the material of the anode layer 31 may be, for example, ITO/Ag/ITO. The anode layer 31 may be formed by means of a sputtering process, a gluing process, an exposure and development process, and so on.

Figure 12:
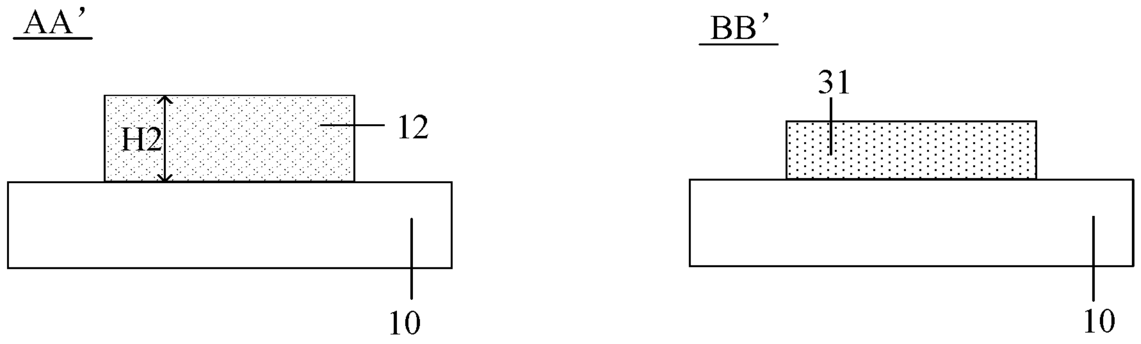
FIG. 12 a schematic diagram showing a cross-sectional structure schematic diagram of the display base plate after completing the preparation of the second retaining wall.

(2) Forming the second retaining wall 12 on the substrate 10 on which the anode layer 31 is formed by adopting the first patterning process, as shown in FIG. 12.

Figure 13:
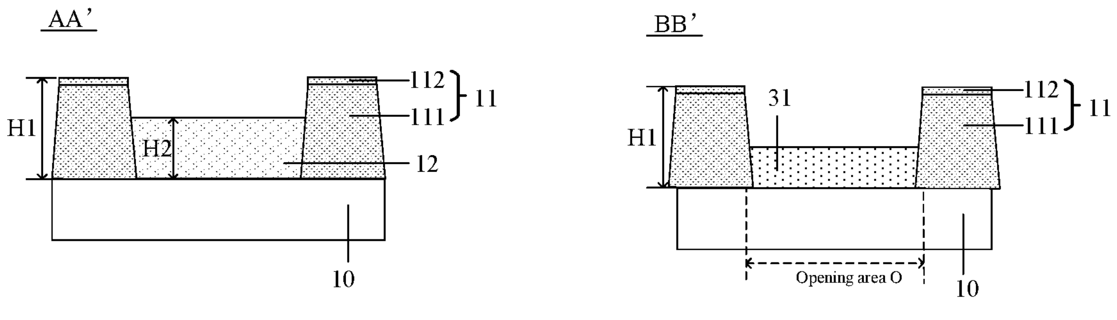
FIG. 13 a schematic diagram showing a cross-sectional structure schematic diagram of the display base plate after completing the preparation of the first retaining wall.

(3) Forming the first retaining wall 11 on the substrate 10 on which the second retaining wall 12 is formed by adopting the second patterning process, as shown in FIG. 13.

Wherein, the second retaining wall 12 has a second height H2 in the direction perpendicular to a plane that the substrate 10 is located, and the first retaining wall 11 has a first height H1 in the direction perpendicular to the plane that the substrate 10 is located, and the first height H1 is higher than the second height H2. The first retaining wall 11 and the second retaining wall 12 jointly define a plurality of opening areas O.

Figure 14:
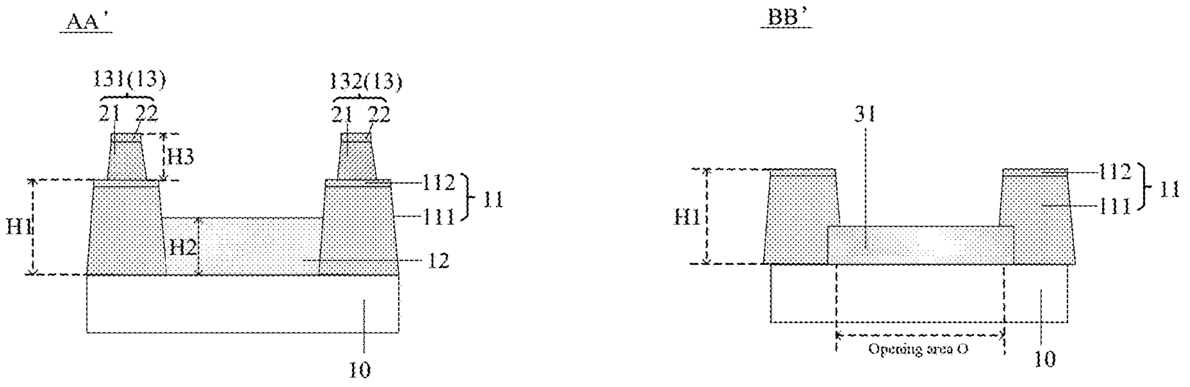
FIG. 14 a schematic diagram showing a cross-sectional structure schematic diagram of the display base plate after completing the preparation of the third retaining wall.

(4) Forming a third retaining wall 13 on the first retaining wall 11 by adopting a third patterning process, as shown in FIG. 14.

Figure 15:
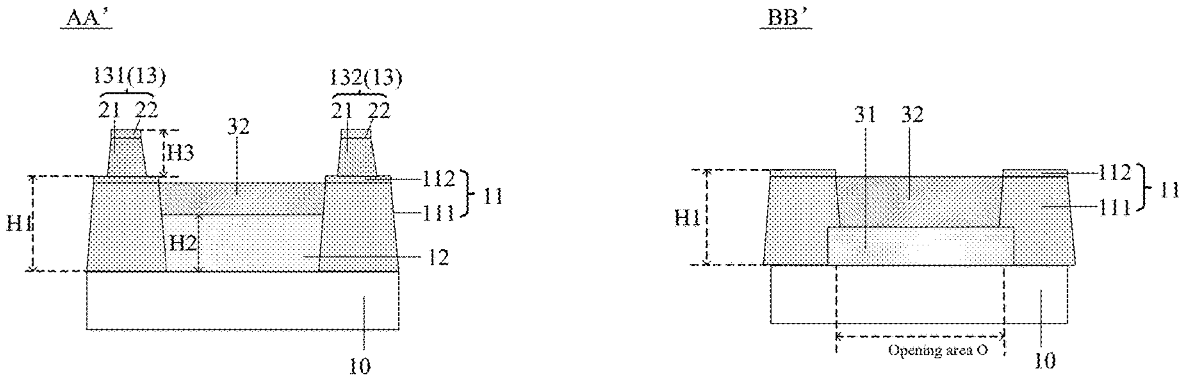
FIG. 15 a schematic diagram showing a cross-sectional structure schematic diagram of the display base plate after completing the preparation of the organic material layer.

(5) Printing a solution of the material of the organic material layer 32 into every opening area O by adopting an ink-jet printing process, and the film is formed by vacuum drying and a solvent in the ink is removed by baking thereafter, so that forming the organic material layer 32, as shown in FIG. 15. The organic material layer 32 includes a hole injection layer, a hole transport layer and a light-emitting layer, and the hole injection layer is disposed close to the anode layer 31.

Figure 16:
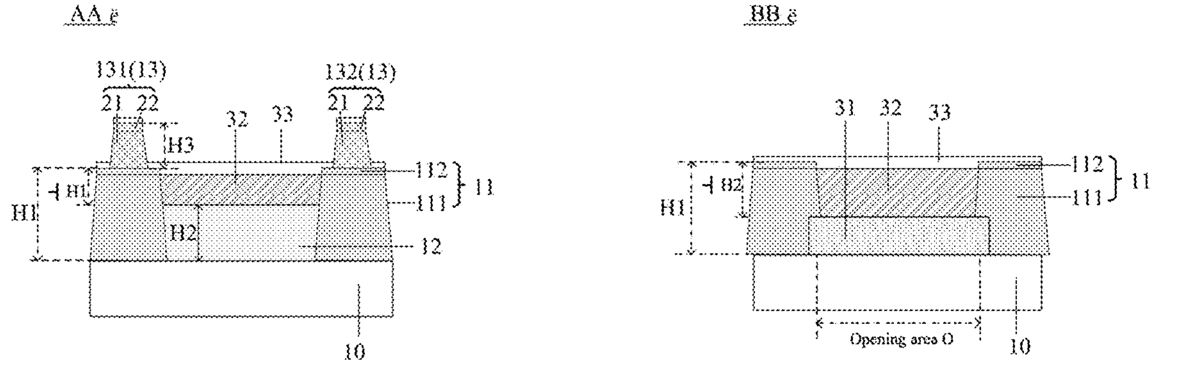
FIG. 16 a schematic diagram showing a cross-sectional structure schematic diagram of the display base plate after completing the preparation of a cathode layer.

(6) Forming an electron transport layer, an electron injection layer and a cathode layer on A side of the organic material layer 32 facing away from the substrate 10 in sequence by evaporation to obtain an auxiliary functional film layer 33, as shown in FIG. 16. The auxiliary functional film layer 33 may be a whole surface structure covering the substrate 10.

The preparation method provided in the present disclosure is simple to operate and easy in mass production.

Every embodiment in the present specification is described in a progressive way, and every embodiment focuses on the differences from other embodiments, so it is merely necessary to refer to the same and similar parts of every embodiment.

Finally, it should be noted that, unless otherwise defined, the words "first", "second" and similar words used in this article do not indicate any order, number or importance, but are merely used to distinguish different components. Moreover, the terms "include", "include" or any other variation thereof are intended to cover non-exclusive inclusion, so that a process, a method, a commodity or an apparatus including a series of elements includes not merely those elements, but also other elements not explicitly listed or elements inherent to such process, method, commodity or apparatus. Without more restrictions, an element defined by the phrase "including one" does not exclude the existence of other identical elements in the process, method, commodity or apparatus including the element. Similar words for example "connect" or "link" are not limited to physical or mechanical connection, but may include electrical connection, whether direct or indirect.

The display base plate, the preparation method thereof and the display device provided by the present disclosure are described in detail above. In the present disclosure, particular examples are used to explain the principle and implementation of the present disclosure. The description of the above examples is merely used to help understand the method and core idea of the present disclosure. At the same time, according to the idea of the present disclosure, changes may exist in the particular implementation and application scope for a person skilled in the art. To sum up, the contents of the present description should not be understood as limitations to the present disclosure.

Other embodiments of the present disclosure will easily occur to a person skilled in the art after considering the description and practicing the invention disclosed herein. The present disclosure is intended to cover any variations, uses, or adaptations of the present disclosure following the general principles of the present disclosure and including common general knowledge or customary technical means in the art not disclosed in the present disclosure. The description and examples are to be regarded as exemplary merely, with the true scope and spirit of the disclosure being indicated by the following claims.

It should be understood that, the present disclosure is not limited to the precise structure described above and shown in the drawings, and various modifications and changes may be made without departing from its scope. The scope of the present disclosure is limited merely by the appended claims.

As referred to herein, "one embodiment", "an embodiment", or "one or more embodiments" means that a particular feature, structure, or characteristic described in combination with the embodiment is included in at least one embodiment of the present disclosure. In addition, please note that the word examples "in one embodiment" herein do not necessarily refer to the same embodiment.

In the description provided herein, numerous particular details are illustrated. However, it is to be understood that, embodiments of the present disclosure may be practiced without these specific details. In some instances, well-known methods, structures and technologies have not been shown in detail, so that not to obscure the understanding of the present description.

In the claims, any reference signs placed between parentheses shall not be constructed as limitations on the claims. The word "include" does not exclude the presence of elements or steps not listed in a claim. The word "a" or "an" preceding an element does not exclude the presence of a plurality of such elements. The present disclosure may be realized by means of hardware including several different elements and by means of a suitably programmed computer. In the unit claims enumerating several devices, several of these devices may be embodied by the same hardware item. The use of words first, second, and third and the like does not represent any order. These words may be interpreted as names.

Finally, it should be explained that, the above embodiments are merely used to illustrate the technical solution of the present disclosure, but not to limit it. Although the present disclosure has been described in detail with reference to the foregoing embodiments, a person skilled in the art should understand that, it is still possible to modify the technical solutions described in the foregoing embodiments, or to replace some technical features with equivalents. However, these modifications or substitutions do not make the essence of the corresponding technical solutions deviate from the spirit and scope of the technical solutions of various embodiments of the present disclosure.

The invention claimed is:

1. A display base plate, comprising a plurality of sub-pixels, the display base plate comprises a substrate and a pixel defining layer disposed at a side of the substrate, wherein:

the pixel defining layer comprises a first retaining wall, a second retaining wall and a third retaining wall;

the first retaining wall and the second retaining wall are configured to form an opening area of the sub-pixel, the first retaining wall is located between the opening areas of adjacent sub-pixels having different colors, and the second retaining wall is located between the opening areas of adjacent sub-pixels having the same color;

the third retaining wall is disposed at a side of the first retaining wall facing away from the substrate, and an orthographic projection of the third retaining wall on the substrate is located within a range of an orthographic projection of the first retaining wall on the substrate;

a surface of a side of the first retaining wall away from the substrate is higher than a surface of a side of the second retaining wall away from the substrate, and is lower than a surface of a side the third retaining wall away from the substrate;

the adjacent sub-pixels having different colors are disposed along a row direction, and the adjacent sub-pixels having the same color are disposed along a column direction; and in the column direction, the orthographic projection of the third retaining wall on the substrate covers an orthographic projection of the opening area on the substrate.

2. The display base plate according to claim 1, wherein in the row direction, the orthographic projection of the third retaining wall on the substrate is located within the range of the orthographic projection of the first retaining wall on the substrate.

3. The display base plate according to claim 2, wherein in the row direction, the orthographic projection of the third retaining wall on the substrate is located within the middle of the orthographic projection of the first retaining wall on the substrate.

4. The display base plate according to claim 2, wherein the third retaining walls respectively located at sides of the two adjacent first retaining walls facing away from the substrate are arranged symmetrically with respect to the symmetry axis; wherein an extension direction of the symmetry axis is the column direction, and the two first retaining walls are disposed adjacent to each other in the row direction.

5. The display base plate according to claim 2, wherein a plurality of the third retaining walls are spaced apart from each other in the column direction, and a space between the two adjacent third retaining walls is larger than or equal to a size of the opening area of at least one sub-pixel.

6. The display base plate according to claim 5, wherein in the column direction, the space between the two adjacent third retaining walls is less than or equal to the size of ten sub-pixels.

7. The display base plate according to claim 2, wherein, in the row direction, the distance between the orthographic projection boundary of the third retaining wall on the substrate and the orthographic projection boundary of the first retaining wall on the substrate is larger than or equal to 0.5 micrometer and less than or equal to 10 micrometer.

8. The display base plate according to claim 1, wherein the materials of the first retaining wall, the second retaining wall and the third retaining wall are all fluorinated photoresist, the fluorine content in the first retaining wall is larger than that in the second retaining wall, and the fluorine content in the third retaining wall is larger than that in the second retaining wall; or, the materials of the first retaining wall and the third retaining wall are both fluorine-containing photoresist, and the material of the second retaining wall is fluorine-free photoresist.

9. The display base plate according to claim 1, wherein the first retaining wall comprises a first material layer and a second material layer which are disposed in a stacked manner, and the second material layer is located at a side of the first material layer facing away from the substrate; wherein the first material layer has a lyophilic property and the second material layer has a lyophobic property.

10. The display base plate according to claim 1, wherein the second retaining wall has a lyophilic property.

11. The display base plate according to claim 1, wherein at least a part of the third retaining wall has a lyophobic property.

12. The display base plate according to claim 1, wherein the display base plate further comprises an organic material layer disposed in the opening area;

a surface of a side of the organic material layer facing away from the substrate is higher than a surface of the side of the second retaining wall away from the substrate, and is lower than a surface of the side of the first retaining wall away from the substrate.

13. The display base plate according to claim 1, wherein in a direction perpendicular to the substrate, the height of the first retaining wall is larger than or equal to 0.5 micrometer and less than or equal to 2.0 micrometer; and/or, in a direction perpendicular to the substrate, the height of the second retaining wall is larger than or equal to 0.3 micrometer and less than or equal to 2.0 micrometer; and/or, in a direction perpendicular to the substrate, the height of the third retaining wall is larger than or equal to 0.3 micrometer and less than or equal to 2.0 micrometer.

14. The display base plate according to claim 2, wherein in the row direction, the thickness of the first retaining wall is larger than or equal to 5 micrometer and less than or equal to 100 micrometer; and/or, in the column direction, the thickness of the second retaining wall is larger than or equal to 5 micrometer and less than or equal to 100 micrometer.

15. The display base plate according to claim 1, wherein the orthographic projection shape of the third retaining wall on the substrate comprises at least one of the following: a triangle, a rectangle, a square, a diamond, a trapezoid, a parallelogram, an ellipse and a circle.

16. A display device, comprising the display base plate according to claim 1.

17. A preparation method of a display base plate, wherein the display base plate comprises a plurality of sub-pixels, the preparation method comprises:

providing a substrate; and forming a pixel defining layer on a side of the substrate, wherein:

the pixel defining layer comprises a first retaining wall, a second retaining wall and a third retaining wall;

the first retaining wall and the second retaining wall are configured to form an opening area of the sub-pixel, the first retaining wall is located between the opening areas of adjacent sub-pixels having different colors, and the second retaining wall is located between the opening areas of adjacent sub-pixels having the same color;

the third retaining wall is disposed on a side of the first retaining wall facing away from the substrate, and an orthographic projection of the third retaining wall on the substrate is within a range of an orthographic projection of the first retaining wall on the substrate;

a surface of a side of the first retaining wall away from the substrate is higher than a surface of a side of the second retaining wall away from the substrate, and is lower than a surface of a side of the third retaining wall away from the substrate;

the adjacent sub-pixels having different colors are disposed along a row direction, and the adjacent sub-pixels having the same color are disposed along a column direction; and in the column direction, the orthographic projection of the third retaining wall on the substrate covers an orthographic projection of the opening area on the substrate.

18. The preparation method according to claim 17, wherein the step of forming the pixel defining layer on the side of the substrate comprises:

by adopting a one-time patterning process, synchronously forming the first retaining wall, the second retaining wall and the third retaining wall at a side of the substrate; or, by adopting a first patterning process, synchronously forming the first retaining wall and the second retaining wall at a side of the substrate, and by adopting a second patterning process, forming the third retaining wall at a side of the first retaining wall facing away from the substrate; or, by adopting three patterning processes respectively, forming the second retaining wall, the first retaining wall and the third retaining wall sequentially on a side of the substrate.

* * * * *